(12) United States Patent
Zuo (10) Patent No.: US 10,177,013 B2
(45) Date of Patent: Jan. 8, 2019

(54) MONOCRYSTAL AND POLYCRYSTAL TEXTURING DEVICE (71) Applicant: CHANGZHOU S.C EXACT EQUIPMENT CO., LTD., Changzhou, Jiangsu Province (CN)

(72) Inventor: Guojun Zuo, Changzhou (CN)

(73) Assignee: CHANGZHOU S.C EXACT EQUIPMENT CO., LTD., Changzhou, Jiangsu Province (CN)

( * ) Notice: Subject to any disclaimer, the term of this patent is extended or adjusted under 35 U.S.C. 154(b) by 0 days.

(21) Appl. No.: 15/866,736

(22) Filed: Jan. 10, 2018

(65) Prior Publication Data

US 2018/0166299 A1    Jun. 14, 2018

Related U.S. Application Data (63) Continuation of application No. PCT/CN2015/091617, filed on Oct. 10, 2015.

(30) Foreign Application Priority Data

Sep. 6, 2015  (CN) .......................... 2015 1 0556630

(51) Int. Cl.
*H01L 21/67* (2006.01)
*C30B 33/10* (2006.01)
(Continued)

(52) U.S. Cl.
CPC ........ *H01L 21/67023* (2013.01); *B08B 3/022* (2013.01); *B08B 3/041* (2013.01);
(Continued)

(58) Field of Classification Search
CPC combination set(s) only.
See application file for complete search history.

(56) References Cited

U.S. PATENT DOCUMENTS

2006/0068597 A1    3/2006  Hauser et al.

FOREIGN PATENT DOCUMENTS

| CN | 202940263 U | 5/2013 |
|---|---|---|
| CN | 103151423 A | 6/2013 |

(Continued)

OTHER PUBLICATIONS

Machine translation of CN 103441070.*

(Continued)

*Primary Examiner* — Erin F Bergner
(74) *Attorney, Agent, or Firm* — Locke Lord LLP; Tim Tingkang Xia, Esq.

(57) ABSTRACT

A monocrystal and polycrystal texturing device includes a device body, various stations arranged in the device body, a transmission device and a control system. The various stations are respectively a dipping acid texturing station, a spray washing station, a drying station, a spray alkali texturing station, a spray washing station, a dipping acid treatment station, a spray washing station, an acid treatment station, a spray washing station and a drying station arranged in sequence. The transmission device is for transmitting a silicon wafer to each station in sequence. The spray alkali texturing station is also connected with a heating device. The control system controls the working status of each station and the heating device. The technology of the present invention has the advantages of stable operation, high efficiency and reliability, and can conduct seamless switching among polycrystal acid texturing, monocrystal alkali texturing, monocrystal acid texturing, and monocrystal alkali texturing.

17 Claims, 7 Drawing Sheets

(51) Int. Cl.
  *H01L 31/18* (2006.01)
  *B08B 3/02* (2006.01)
  *C30B 29/06* (2006.01)
  *B08B 3/04* (2006.01)
  *H01L 31/0236* (2006.01)

(52) U.S. Cl.
  CPC .............. *C30B 29/06* (2013.01); *C30B 33/10* (2013.01); *H01L 31/18* (2013.01); *H01L 31/02363* (2013.01); *H01L 31/182* (2013.01); *H01L 31/1876* (2013.01); *Y02P 70/521* (2015.11)

(56) References Cited

FOREIGN PATENT DOCUMENTS

| | | |
|---|---|---|
| CN | 103441070 A | 12/2013 |
| CN | 103762280 A | 4/2014 |
| CN | 105047763 A | 11/2015 |
| CN | 205024353 U | 2/2016 |

OTHER PUBLICATIONS

Machine translation of CN 103762280.*
International Search Report of PCT/CN2015/091617, dated May 24, 2016.
Mao, Zhaobin et al., Research of Equipment by Cells High Productivity and Technology for Crystalline Silicon, Equipment for Electronic Products Manufacturing, The 48th Research Institute of CETC, 2012, 212.

* cited by examiner

MONOCRYSTAL AND POLYCRYSTAL TEXTURING DEVICE

CROSS-REFERENCE TO RELATED PATENT APPLICATION

This application is a continuation application of International Patent Application No. PCT/CN2015/091617, filed on Oct. 10, 2015, which itself claims priority to Chinese Patent Application No. CN201510556630.1 filed in China on Sep. 6, 2015. The disclosures of the above applications are incorporated herein in their entireties by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to the field of silicon wafer texturing device technology, and more particularly, to a monocrystal and polycrystal texturing device.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

In recent years, the solar energy silicon cell technology has been continuously developed, the new technology emerges in endlessly, and the transfer efficiency of the silicon cell is continuously refreshed. Facing to the markets at home and abroad with more and more fierce competition, the elimination of the traditional technology becomes an inexorable trend.

A traditional device is generally used to prepare a monocrystal silicon piece suede in the prior art, the preparation of a monocrystal silicon piece suede and a polycrystal silicon piece suede cannot be achieved by one device, and the device supplier needs to provide upgrading device or technical upgrading for the post cleaning technology regarding to the new technology.

The prior art also has a device specially aiming at polycrystal silicon piece texturing. For example, the patent publication No. CN103441070A is provided with a transmission system, a control system and a polycrystal silicon treatment station, wherein the polycrystal silicon treatment station comprises a mixed acid texturing station, a spray washing station, an alkali texturing station, a spray washing station, an acid treatment station, and a spray washing station arranged in sequence according to each treatment station, the device can only be used in the technical treatment of polycrystal silicon piece, and cannot implement the monocrystal silicon piece texturing and the polycrystal silicon piece texturing at the same time.

SUMMARY

In order to solve the defects existing in the prior art, the present invention provides a monocrystal and polycrystal texturing device that integrates the monocrystal texturing device with the polycrystal texturing device in the traditional technology, so that the monocrystal texturing and the polycrystal texturing can be realized by one device, and the device has the advantages of reducing the use amount of chemicals, increasing the capacity and facilitating the realization of automation.

The technical solution employed by the present invention is to design a monocrystal and polycrystal texturing device, which comprises a device body, various stations arranged in the device body, a transmission device and a control system, wherein the various stations are respectively a dipping acid texturing station, a spray washing station, a drying station, a spray alkali texturing station, a spray washing station, a dipping acid treatment station, a spray washing station, an acid treatment station, a spray washing station and a drying station arranged in sequence.

Wherein, the transmission device is for transmitting a silicon wafer to each station in sequence, and the control system controls the operating on-off status of each station. The spray alkali texturing station is also connected with a heating device, and the working status of the heating device is controlled by the control system.

The dipping acid texturing station comprises an acid texturing slot, multiple pairs of separation plates separating the acid texturing slot into multiple working liquid chambers, an acid texturing pump for pumping the acid texturing liquid into the working liquid chambers, and an acid texturing sub-slot for collecting the acid texturing liquid in the acid texturing slot; each pair of separation plates are spaced to form a cushion chamber for overflow cycle, and the bottom of the cushion chamber is provided with an output port connected with the acid texturing sub-slot.

The spray washing station comprises: a spray washing slot, a spray header arranged above the spray washing slot, and a water pump for pumping the water washing liquid into the spray header.

The drying station comprises a hot-air blower for providing an air source and a filter for filtering the air source.

The spray alkali texturing station comprises an alkali texturing slot, a spray alkali liquid box arranged above the alkali texturing slot, an alkali texturing pump for pumping the alkali texturing liquid into the spray alkali liquid box, and an alkali texturing sub-slot for collecting the alkali texturing liquid in the alkali texturing slot.

The dipping alkali treatment station comprises an alkali treatment slot, multiple pairs of separation plates separating the alkali treatment slot into multiple working liquid chambers, an alkali treatment pump for pumping the alkali treatment liquid into the working liquid chambers, and an alkali treatment sub-slot for collecting the alkali treatment liquid in the alkali treatment slot, each pair of separation plates are spaced to form a cushion chamber for overflow cycle, and the bottom of the cushion chamber is provided with an output port connected with the alkali treatment sub-slot.

The acid texturing pump, the water pump, the hot-air blower, the alkali texturing pump and the alkali treatment pump are respectively connected with the control system, and the control system controls the on-off status thereof.

The acid treatment station has are two feasible structures, and the acid treatment pumps in both of the two structures are connected with the control systems, and the control system controls the on-off status thereof. The first is the dipping treatment, and the acid treatment station comprises an acid treatment slot, multiple pairs of separation plates separating the acid treatment slot into multiple working liquid chambers, an acid treatment pump for pumping the acid treatment liquid into the working liquid chambers, and an acid treatment sub-slot for collecting the alkali treatment liquid in the acid treatment slot, each pair of separation plates are spaced to form a cushion chamber for overflow cycle, and the bottom of the cushion chamber is provided with an output port connected with the acid treatment sub-slot.

The second is the spray treatment, and the acid treatment station comprises an acid treatment slot, a spray acid liquid box arranged above the acid treatment slot, an acid treatment pump for pumping the acid treatment liquid into the spray acid liquid box, and an acid treatment sub-slot for collecting the alkali treatment liquid in the acid treatment slot.

The heating device comprises a heater installed in the alkali texturing sub-slot or a circulation pipeline, and a temperature detector, and both the heater and the temperature detector are connected with the control system.

Preferably, the spray washing station between the dipping acid texturing station and the drying station is not provided with a spray washing sub-slot, and the remaining spray washing stations are all provided with a spray washing sub-slot for collecting the water washing liquid in the spray washing slot.

Preferably, the dipping acid texturing station, the spray alkali texturing station, the dipping alkali treatment station and the acid treatment station are all connected with an automatic liquid compensation system. The automatic liquid supplementation system comprises a liquid inlet pipe, a liquid supplementation bucket, and a liquid supplementation pipe connected in sequence; the liquid inlet pipe and the liquid supplementation pipe are respectively provided with a control valve connected with the control system, the liquid supplementation bucket is internally provided with a liquid level detector with high accuracy, and one end of the liquid level detector with high accuracy stretches out from the liquid supplementation bucket and is connected with the control system.

Preferably, the acid texturing slot, the spray washing slot, the alkali texturing slot, the spray washing slot, the alkali treatment slot, the spray washing slot, the acid treatment slot and the spray washing slot arranged in sequence form a main slot group, the slots in the main slot group are also provided with a water retaining component, and a sealing structure is arranged between adjacent slots in the main slot group.

Compared with the prior art, the present invention conducts reasonable combination and arrangement to the existing unit treatment station according to the technology property of the monocrystal texturing and the polycrystal texturing, and then control the working status of various stations by the control system, so that the device can be flexibly adjusted according to the difference between the monocrystal texturing and the polycrystal texturing. When the monocrystal texturing is conducted by the device, the transmission device continuously transmits the silicon wafer forward, and the control system only opens the station required by the monocrystal texturing; and when the polycrystal texturing is conducted by the device, the control system only opens the station required by the polycrystal texturing. The technology of the present invention has the advantages of stable operation, high efficiency and reliability, and can conduct seamless switching among polycrystal acid texturing, monocrystal alkali texturing, monocrystal acid texturing, and monocrystal alkali texturing.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

The present disclosure will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

Figure 1:
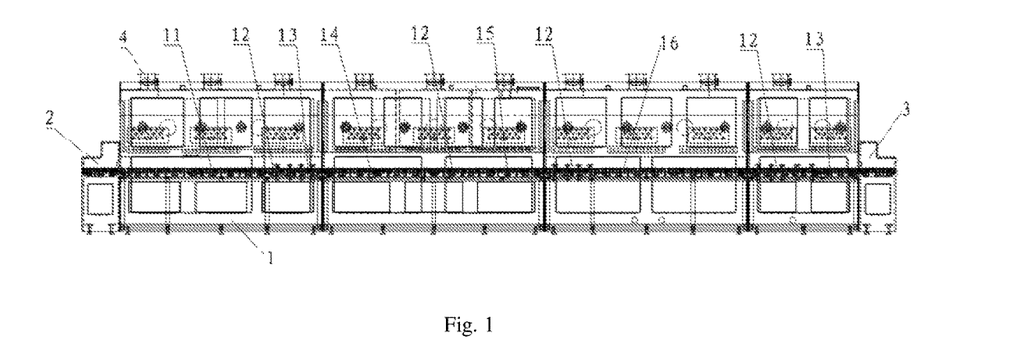
FIG. 1 is an overall structure diagram of the present invention.
Figure 2:
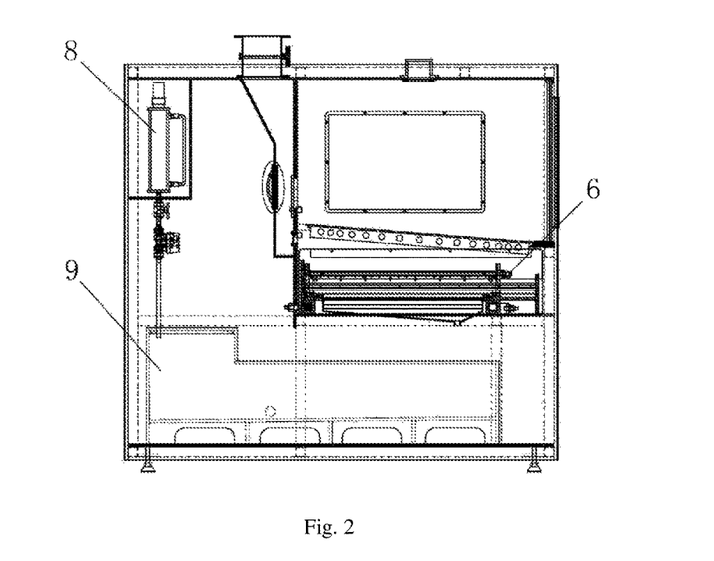
FIG. 2 is a structure diagram of a side face of the present invention.

As shown in FIGS. 1 and 2, a monocrystal and polycrystal texturing device provided by the present invention comprises a device body 1, various stations arranged in the device body in sequence from front to back, a transmission device 6 and a control system, two ends of the device are provided with a feeding platform 2 and a laying-off platform 3, and the top of the device body 1 is provided with an air draft system 4. The various stations are respectively a dipping acid texturing station 11, a spray washing station 12, a drying station 13, a spray alkali texturing station 14, a spray washing station 12, a dipping acid treatment station 15, a spray washing station 12, an acid treatment station 16, a spray washing station 12 and a drying station 13 arranged in sequence. The silicon wafer 7 is placed on the feeding platform 2 in a level manner in using, the feeding platform 2 has an automatic normalization device and a dropping protection device, the entering amount of the wafer is automatically detected by a photoelectric sensor, the prompt function of wafer connection warning is provided, the silicon wafer is transmitted to the various stations by the transmission device 6 in sequence, and then is received after arriving the laying-off platform 3.

Wherein, the working status of the various stations is controlled by the control system, in the treatment technology of the silicon wafer, for example, the dipping treatment station generally uses a power pump to treat the silicon wafer 7 by pumping liquid, and when the power pump does not work, the liquid cannot be contacted with the silicon wafer 7, and the silicon wafer is not treated at this station. Therefore, the control system actually controls the power pump or other power elements of the various stations, when the power element does not work, the station is in a closing status, the silicon wafer 7 passes through the station by the transmission device 6 without reaction, and when the power element works, the station is in an opening status, and the silicon wafer passes through the station by the transmission device 6 with reaction. The control system can flexibly select the station needing to be opened according to the difference of technologies including the monocrystal or polycrystal texturing, so as to achieve the purpose that the polycrystal acid texturing, the monocrystal alkali texturing, the monocrystal acid texturing and the monocrystal alkali texturing can be conducted by one device.

Figure 3:
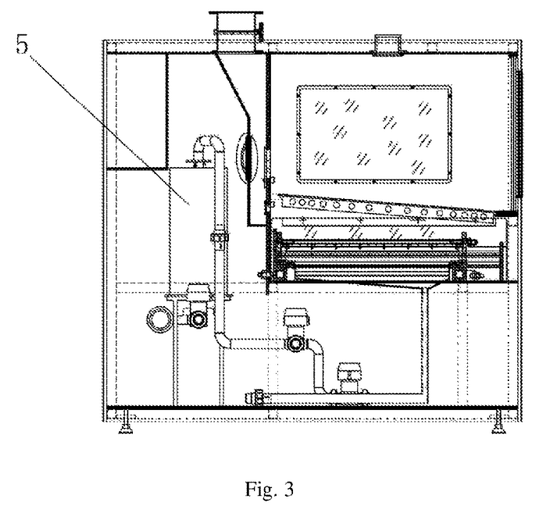
FIG. 3 is a structure diagram of another side face of the present invention.

As shown in FIG. 3, since the temperature of treatment liquid required in the alkali texturing of the monocrystal or polycrystal texturing is different, the spray alkali texturing station is also connected with the heating device 5, and the working status of the heating device 5 is controlled by the control system.

Specifically, the transmission device 6 comprises a longitudinally and uniformly arranged delivery roll 61 and an electric element driving the delivery roll 61 to rotate, the slot of the various stations is arranged under the delivery roll 61, and when the delivery roll 61 is rotated, the silicon wafer 7 continuously moves forward to pass through the various stations.

Figure 4:
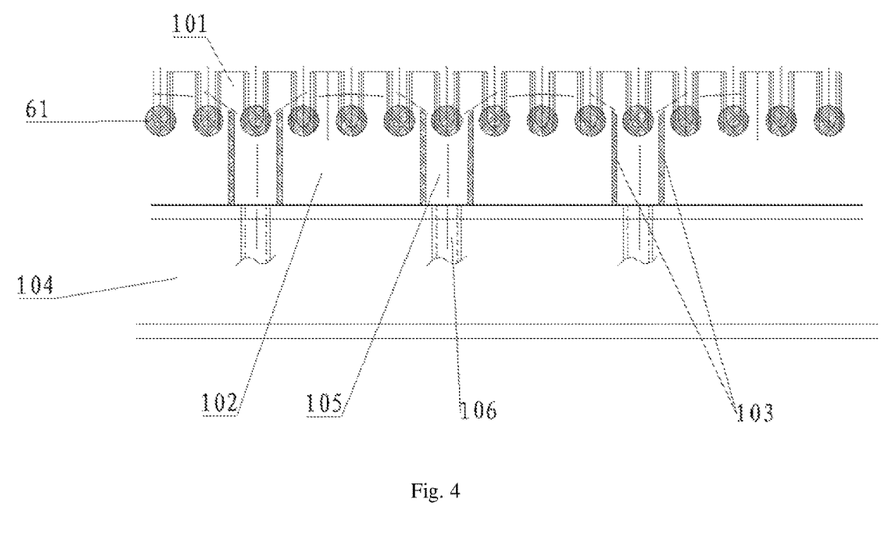
FIG. 4 is a structure diagram of a dipping acid texturing station of the present invention.

As shown in FIG. 4, the dipping acid texturing station comprises an acid texturing slot 101, multiple pairs of separation plates 103 separating the acid texturing slot 101 into multiple working liquid chambers 102, an acid texturing pump for pumping the acid texturing liquid into the working liquid chambers 102, and an acid texturing sub-slot 104 for collecting the acid texturing liquid in the acid texturing slot 101; each pair of separation plates 103 are spaced to form a cushion chamber 105 for overflow cycle, and the bottom of the cushion chamber 105 is provided with an output port 106 connected with the acid texturing sub-slot 104. The top surface of the delivery roll 61 at the dipping acid texturing station holds the line with the top surface of the acid texturing slot 101, or is a litter higher than the acid texturing slot 101. The function of the dipping acid texturing station is to conduct the acid liquid suede treatment, when the silicon wafer 7 is transmitted to pass through the acid texturing slot 101 in a level manner, the acid texturing pump pumps the acid texturing liquid in the working liquid chambers 102, under the power effect of the pump, the acid treatment liquid is higher than the delivery roll 61 to immerse the silicon wafer 7, the silicon wafer 7 and the acid liquid have a chemical reaction, the acid liquid flowing from the working liquid chambers 102 is collected in the sub-slot 104, and then is pumped from the acid texturing slot 101 by the acid texturing pump for recycling.

A water-squeezing roller or a water-absorbing roller is arranged at a position between the dipping acid texturing station and the spray washing station on the device body 1, the water-squeezing roller or the water-absorbing roller is arranged above the delivery roll 61 at the position, the superfluous medical liquid on the silicon wafer 7 is pressed by the water-squeezing roller, and the water-absorbing roller is used for eliminating the medical liquid on the silicon wafer 7.

Figure 5:
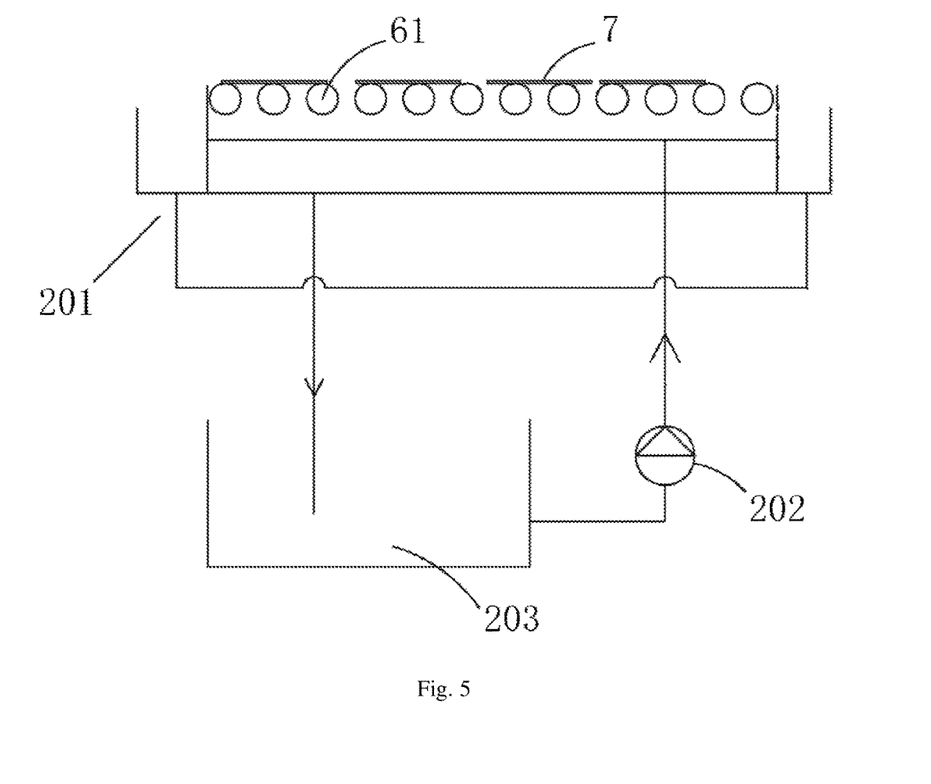
FIG. 5 is a structure diagram of a spray washing station of the present invention.

As shown in FIG. 5, the spray washing station comprises: a spray washing slot 201, a spray header arranged above the spray washing slot 201, and a water pump 202 for pumping the water washing liquid into the spray header. The function of the spray washing station is to eliminate the residual medical liquid on the surface of the silicon wafer 7, the silicon wafer 7 is transmitted in a level manner, and the spray header washes the silicon wafer 7 up and down in a certain angle. The spray washing station between the dipping acid texturing station and the drying station is a first spray washing station, the first spray washing station is not provided with a spray washing sub-slot, the water of the spray washing station is waste water which is discharged directly, other second, third and fourth spray washing stations set in sequence are all provided with a spray washing sub-slot 203 for collecting the water washing liquid in the spray washing slot 201, and then the water is supplied to the spray pipe again by the water pump 202 to save water.

The drying station comprises a hot-air blower for providing an air source and a filter for filtering the air source, and the hot-air blower dries the silicon wafer in an up-and-down air cutting manner. The device body is provided with two drying stations comprising a first drying station located at the front end of the spray alkali texturing station and a second drying station located at the tail end of the device body.

The water-absorbing roller is arranged at the position between the first spray washing station and the first drying station on the device body 1, the water-absorbing roller is arranged above the delivery roller 61 at the position, and the water-absorbing roller absorbs the water washing liquid on the silicon wafer.

Figure 6:
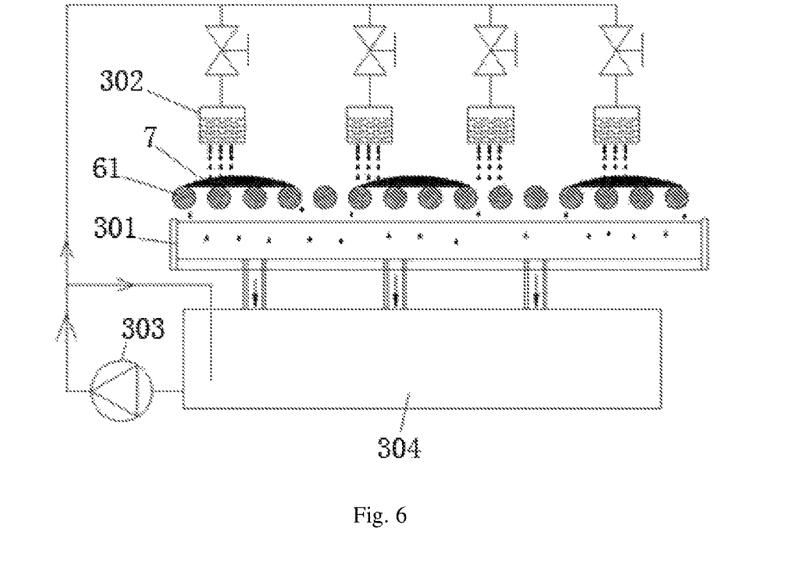
FIG. 6 is a structure diagram of a spray alkali texturing station of the present invention.

As shown in FIG. 6, the spray alkali texturing station comprises an alkali texturing slot 301, a spray alkali liquid box 302 arranged above the alkali texturing slot 301, an alkali texturing pump 303 for pumping the alkali texturing liquid into the spray alkali liquid box 302, and an alkali texturing sub-slot 304 for collecting the alkali texturing liquid in the alkali texturing slot 301. The alkali texturing liquid is pumped to the spray alkali liquid box 302 above the silicon wafer 7 to the upper surface of the silicon wafer 7 to conduct the chemical treatment, and the function of the spray alkali texturing is to conduct alkali texturing to the silicon wafer 7. When the suede of the monocrystal silicon wafer is prepared, the high-temperature treatment is needed, the medical liquid is heated by the heating device 5 and is supplied to the spray alkali liquid box 302 by the pump, the alkali texturing liquid is sprayed on the upper surface of the silicon wafer 7 to effectively increase the treatment quality of the surface of the silicon wafer, the overflowing alkali texturing liquid is collected to the alkali texturing sub-slot 304, and then is supplied to the alkali texturing slot 301 by the alkali texturing pump 303 for recycling.

The second spray washing station is arranged between the spray alkali texturing station and the dipping alkali treatment station, the water-absorbing roller is arranged at the position between the second spray washing station on the device body 1 and the dipping alkali treatment station, the water-absorbing roller is arranged above the delivery roller 61 at the position, and the water-absorbing roller absorbs the water washing liquid on the silicon wafer 7.

The dipping alkali treatment station comprises an alkali treatment slot, multiple pairs of separation plates separating the alkali treatment slot into multiple working liquid chambers, an alkali treatment pump for pumping the alkali treatment liquid into the working liquid chambers, and an alkali treatment sub-slot for collecting the alkali treatment liquid in the alkali treatment slot, each pair of separation plates are spaced to form a cushion chamber for overflow cycle, and the bottom of the cushion chamber is provided with an output port connected with the alkali treatment sub-slot. The function of the dipping alkali treatment station is to eliminate the organic matter of the technology of front section, porous silicon and acid-base neutralization, the structure thereof is the same as the structure of the dipping acid texturing station, the working process of the station is also similar, and the unnecessary details are not given.

The third spray washing station is provided between the dipping alkali treatment station and the acid treatment station, the water-absorbing roller is arranged at the position between the third spray washing station on the device body and the acid treatment station, the water-absorbing roller is arranged above the delivery roller at the position, and the water-absorbing roller absorbs the water washing liquid on the silicon wafer.

The function of the acid treatment station is to eliminate phosphorosilicate glass and metal ion on the front face of the silicon wafer to make preparation for the next process. There are two feasible structures, the first is the dipping treatment, the acid treatment station comprises an acid treatment slot, multiple pairs of separation plates separating the acid treatment slot into multiple working liquid chambers, an acid treatment pump for pumping the acid treatment liquid into the working liquid chambers, and an acid treatment sub-slot for collecting the alkali treatment liquid in the acid treatment slot, each pair of separation plates are spaced to form a cushion chamber for overflow cycle, and the bottom of the cushion chamber is provided with an output port connected with the acid treatment sub-slot. The structure of the dipping treatment is the same as the dipping acid texturing station, the working process of the station is also similar, and the unnecessary details are not given.

The second is the spray treatment, and the acid treatment station comprises an acid treatment slot, a spray acid liquid box arranged above the acid treatment slot, an acid treatment pump for pumping the acid treatment liquid into the spray acid liquid box, and an acid treatment sub-slot for collecting the alkali treatment liquid in the acid treatment slot. The structure of the spray treatment is the same as the dipping alkali texturing station, the working process of the station is also similar, and the unnecessary details are not given.

The fourth spray washing station and the second drying station are arranged at the tail end of the acid treatment station in sequence, the water-absorbing roller is arranged at the position between the fourth spray washing station on the device body and the second drying station, the water-absorbing roller is arranged above the delivery roller at the position, and the water-absorbing roller absorbs the water washing liquid on the silicon wafer.

The contents above are basic composition and structure of the various stations.

In the embodiment, the heating device 5 in the spray alkali texturing station comprises: a heater installed in the alkali texturing sub-slot 304 or a circulation pipeline and a temperature detector, and both the heater and the temperature detector are connected with the control system.

Figure 7:
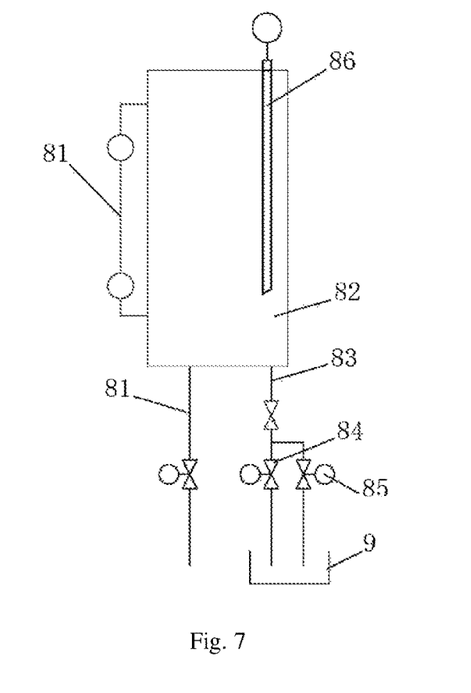
FIG. 7 is a structure diagram of an automatic liquid compensation system of the present invention.

Preferably, the dipping acid texturing station, the spray alkali texturing station, the dipping alkali treatment station and the acid treatment station are all connected with an automatic liquid compensation system 8. As shown in FIG. 7, the automatic liquid supplementation system 8 comprises a liquid inlet pipe 81, a liquid supplementation bucket 82, and a liquid supplementation pipe 83 connected in sequence, and the liquid supplementation pipe 83 stretches in a sub-slot 9. The liquid inlet pipe 81 and the liquid supplementation pipe 83 are respectively provided with a control valve connected with the control system, wherein the control valve connected with the liquid supplementation pipe 83 is a pair of parallel fine supplementation valve 84 and a rough supplementation valve 85. The liquid supplementation bucket 82 is internally provided with the liquid level detector 86 with high accuracy, and one end thereof stretches out from the liquid supplementation bucket 82 and is connected with the control system. An ultrasonic wave liquid level detector may be used in the liquid level detector with high accuracy, which greatly increases the accuracy of the addition of medical liquid, guarantees that the added medical liquid complies with the height of actual formula, and can greatly reduce the effect of temperature change, unstable air pressure, valve retardation and other factors on the system. The stability of the device is increased.

Figure 8:
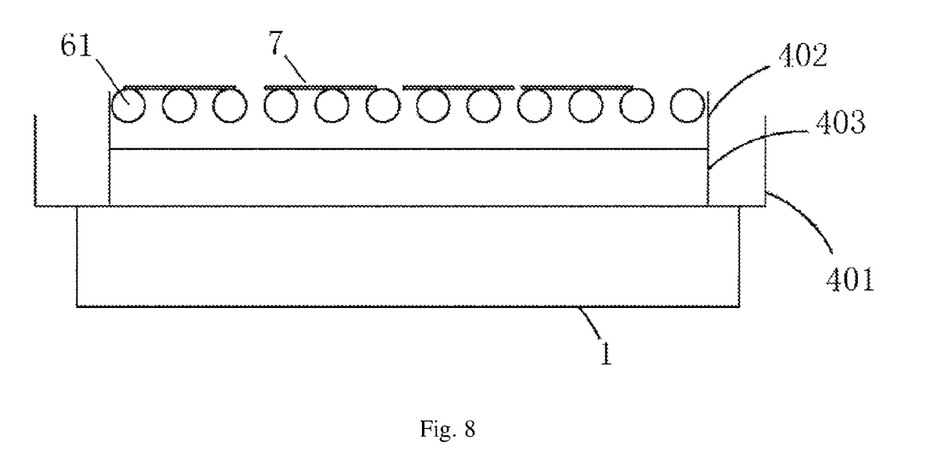
FIG. 8 is a structure diagram of a main slot group and double-layer slot of the present invention.

Further, the acid texturing slot, the spray washing slot, the alkali texturing slot, the spray washing slot, the alkali treatment slot, the spray washing slot, the acid treatment slot and the spray washing slot arranged in sequence are a main slot group. Preferably, the structure is as shown in FIG. 8, a double-layer slot structure is used in the slot in the main slot group, and of course, a single-layer slot may also be used in actual use. The double-layer slot structure comprises a lower slot 401 fixedly installed on the device body 1, an upper slot 402 upwardly stretching out from the slot bottom of the lower slot 401, which is higher than the upper slot 402 at the top end thereof, a support 403 downwardly stretches out from the side wall of the upper slot 402, the support is fixed with the slot bottom of the lower slot, and both the length and the width of the upper slot 402 are smaller than the length and the width of the lower slot 401.

Figure 9:
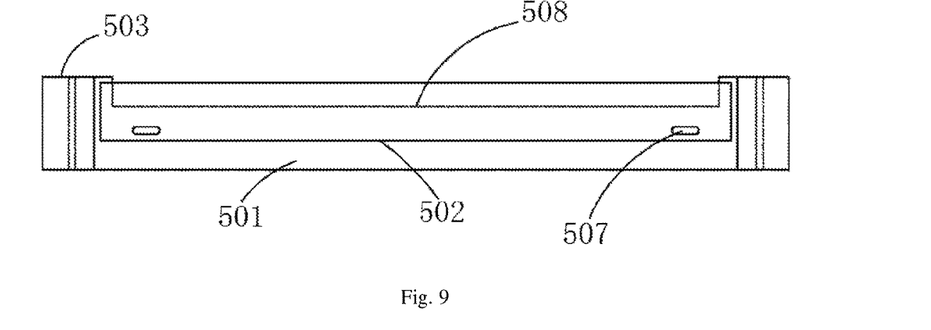
FIG. 9 is a main view diagram of partial structure of a water retaining component of the present invention.
Figure 10:
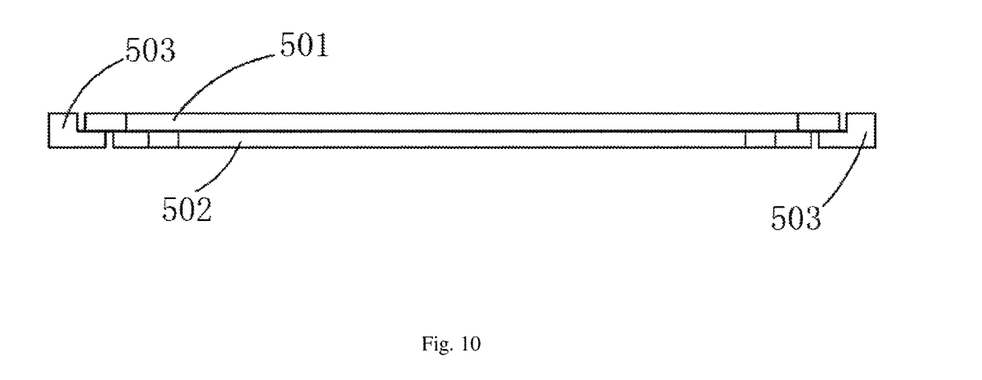
FIG. 10 is a vertical view diagram of FIG. 9.
Figure 11:
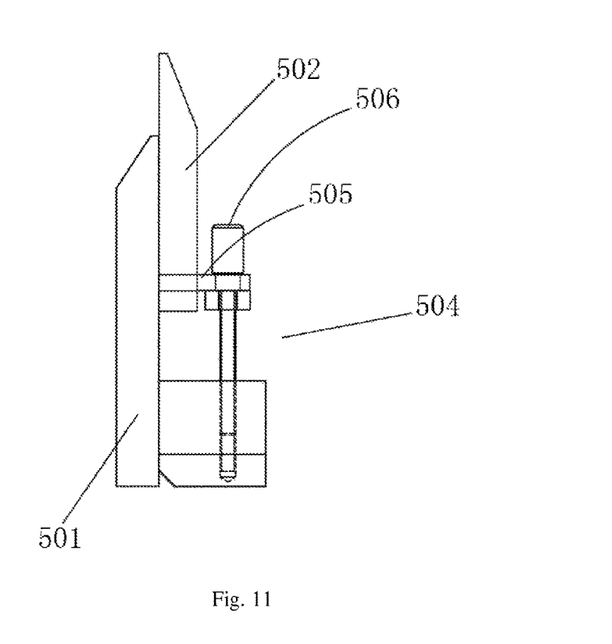
FIG. 11 is a side face diagram that a height adjustment device and the water retaining component in FIG. 9 are assembled.

The slots in the main slot group are also provided with a water retaining component, as shown in FIGS. 9 and 10, and the water retaining component comprises: a fixing plate 501 fixed on the baseboard of the main slot, a water retaining plate 502 installed on the fixing plate 501 that can slide up and down, and a side plate 503 fixed on the side plate of the main slot. The fixing plate 501 is fitly installed with the side plate 503 and the water retaining plate 502, the side of the side plate 503 is provided with a gap with the fixing plate 501 and the water retaining plate 502. As shown in FIG. 11, the water retaining component further comprises a height adjustment device 504 installed on the outer side of the water retaining plate 502, a clamping part 505 transversely stretches out from the upper end of the device, the top part is provided with a handle 506, the water retaining plate 502 is provided with an adjustment hole 507 matched with the clamping part 505, the side plate 503 is a right-angle bending plate, a bending face thereon is fitted with the fixing plate 501, the top end of the fixing plate 501 is provided with a concave 508, and the length of the concave 508 is smaller than the length of the water retaining plate 502.

Figure 12:
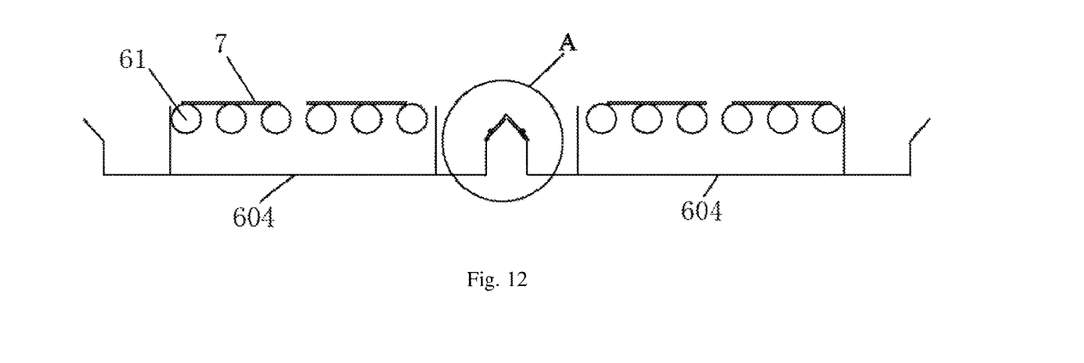
FIG. 12 is a diagram of a sealing structure between the main slot group of the present invention.
Figure 13:
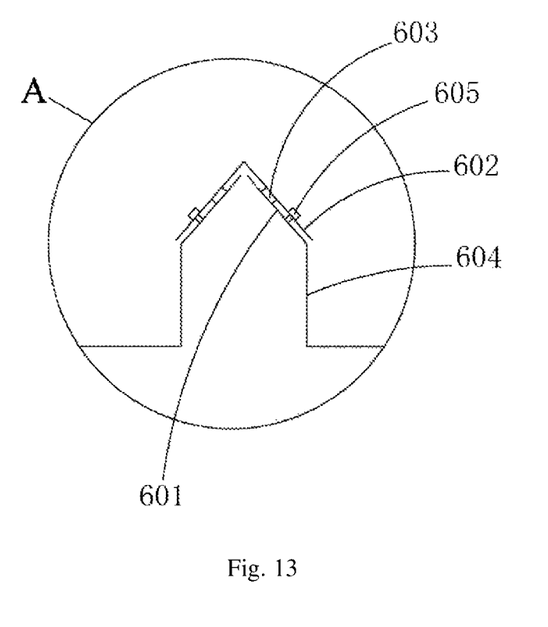
FIG. 13 is an enlarged diagram of part A in FIG. 12.

A sealing structure is arranged between adjacent slots in the main slot group, as shown in FIGS. 12 and 13, the sealing structure comprises a sealing plate 601 arranged at the top part of two side walls of the main slot 604, a cover plate 602 arranged on two adjacent sealing plates 601, the sealing plate 601 inclines toward the outer side of the slot 604, the cover plate 602 is in a reverse V shape, a sealing bar 603 is arranged between the cover plate 602 and the sealing plate 601, and the cover plate 602, the sealing bar 603 and the sealing plate 601 are tightly connected through screws 605.

The description above is only the preferable embodiment of the present invention, and is not used to limit the present invention. Any modification, equal replacement and improvement made in the spirit and principle of the present invention shall fall in the protection scope of the present invention.

What is claimed is:

1. A monocrystal and polycrystal texturing device, comprising a device body, various stations arranged in the device body, a transmission device and a control system, wherein the various stations are respectively a dipping acid texturing station, a first spray washing station, a first drying station, a spray alkali texturing station, a second spray washing station, a dipping alkali treatment station, a third spray washing station, an acid treatment station, a fourth spray washing station and a second drying station arranged in sequence from front to back, the transmission device is for transmitting a silicon wafer to each station in sequence, the control system controls the operating on-off status of each station, and when the device conducts monocrystal texturing, the control system only opens the stations required by monocrystal texturing; and when the device conducts polycrystal texturing, the control system only opens the stations required by polycrystal texturing;

the dipping acid texturing station comprises an acid texturing slot, multiple pairs of separation plates separating the acid texturing slot into multiple working liquid chambers, an acid texturing pump for pumping the acid texturing liquid into the working liquid chambers, and an acid texturing sub-slot for collecting the acid texturing liquid in the acid texturing slot; each pair of separation plates are spaced to form a cushion chamber for overflow cycle, and the bottom of the cushion chamber is provided with an output port connected with the acid texturing sub-slot;

each of the first, second, third and fourth spray washing stations comprises: a spray washing slot, a spray header arranged above the spray washing slot, and a water pump for pumping the water washing liquid into the spray header;

each of the first drying station and the second drying station comprises a hot-air blower for providing an air source and a filter for filtering the air source;

the spray alkali texturing station comprises an alkali texturing slot, a spray alkali liquid box arranged above the alkali texturing slot, an alkali texturing pump for pumping the alkali texturing liquid into the spray alkali liquid box, and an alkali texturing sub-slot for collecting the alkali texturing liquid in the alkali texturing slot;

the dipping alkali treatment station comprises an alkali treatment slot, multiple pairs of separation plates separating the alkali treatment slot into multiple working liquid chambers, an alkali treatment pump for pumping the alkali treatment liquid into the working liquid chambers, and an alkali treatment sub-slot for collecting the alkali treatment liquid in the alkali treatment slot, each pair of separation plates are spaced to form a cushion chamber for overflow cycle, and the bottom of the cushion chamber is provided with an output port connected with the alkali treatment sub-slot; and the acid texturing pump, the water pump, the hot-air blower, the alkali texturing pump and the alkali treatment pump are respectively connected with the control system, and the control system controls the on-off status thereof.

2. The monocrystal and polycrystal texturing device according to claim 1, wherein the spray alkali texturing station is also connected with a heating device, and the working status of the heating device is controlled by the control system.

3. The monocrystal and polycrystal texturing device according to claim 1, wherein the acid treatment station comprises an acid treatment slot, multiple pairs of separation plates separating the acid treatment slot into multiple working liquid chambers, an acid treatment pump for pumping the acid treatment liquid into the working liquid chambers, and an acid treatment sub-slot for collecting the alkali treatment liquid in the acid treatment slot, each pair of separation plates are spaced to form a cushion chamber for overflow cycle, and the bottom of the cushion chamber is provided with an output port connected with the acid treatment sub-slot; and the acid treatment pump is connected with the control system, and the control system controls the on-off status thereof.

4. The monocrystal and polycrystal texturing device according to claim 1, wherein the acid treatment station comprises an acid treatment slot, a spray acid liquid box arranged above the acid treatment slot, an acid treatment pump for pumping the acid treatment liquid into the spray acid liquid box, and an acid treatment sub-slot for collecting the alkali treatment liquid in the acid treatment slot; and the acid treatment pump is connected with the control system, and the control system controls the on-off status.

5. The monocrystal and polycrystal texturing device according to claim 1, wherein the heating device comprises a heater installed in the alkali texturing sub-slot or a circulation pipeline, and a temperature detector, and both the heater and the temperature detector are connected with the control system.

6. The monocrystal and polycrystal texturing device according to claim 3, wherein the first spray washing station between the dipping acid texturing station and the first drying station is not provided with a spray washing sub-slot, and each of the second, third and fourth spray washing stations is provided with a spray washing sub-slot for collecting the water washing liquid in the spray washing slot.

7. The monocrystal and polycrystal texturing device according to claim 1, wherein the dipping acid texturing station, the spray alkali texturing station, the dipping alkali treatment station and the acid treatment station are all connected with an automatic liquid compensation system.

8. The monocrystal and polycrystal texturing device according to claim 7, wherein the automatic liquid supplementation system comprises a liquid supplementation bucket, a liquid inlet pipe and a liquid supplementation pipe, wherein the liquid inlet pipe and the liquid supplementation pipe are respectively connected to the liquid supplementation bucket; the liquid inlet pipe and the liquid supplementation pipe are respectively provided with a control valve connected with the control system, the liquid supplementation bucket is internally provided with a liquid level detector with high accuracy, and one end of the liquid level detector with high accuracy stretches out from the liquid supplementation bucket and is connected with the control system.

9. The monocrystal and polycrystal texturing device according to claim 3, wherein the acid texturing slot, the first spray washing slot of the first spray washing station, the alkali texturing slot, the spray washing slot of the second spray washing station, the alkali treatment slot, the spray washing slot of the third spray washing station, the acid treatment slot and the spray washing slot of the fourth spray washing station arranged in sequence from front to back form a main slot group, the slots in the main slot group are also provided with a water retaining component, and a sealing structure is arranged between adjacent slots in the main slot group.

10. The monocrystal and polycrystal texturing device according to claim 3, wherein the heating device comprises a heater installed in the alkali texturing sub-slot or a circulation pipeline, and a temperature detector, and both the heater and the temperature detector are connected with the control system.

11. The monocrystal and polycrystal texturing device according to claim 4, wherein the heating device comprises a heater installed in the alkali texturing sub-slot or a circulation pipeline, and a temperature detector, and both the heater and the temperature detector are connected with the control system.

12. The monocrystal and polycrystal texturing device according to claim 4, wherein the first spray washing station between the dipping acid texturing station and the first drying station is not provided with a spray washing sub-slot, and each of the second, third and fourth spray washing stations is provided with a spray washing sub-slot for collecting the water washing liquid in the spray washing slot.

13. The monocrystal and polycrystal texturing device according to claim 3, wherein the dipping acid texturing station, the spray alkali texturing station, the dipping alkali treatment station and the acid treatment station are all connected with an automatic liquid compensation system.

14. The monocrystal and polycrystal texturing device according to claim 13, wherein the automatic liquid supplementation system comprises a liquid supplementation bucket, a liquid inlet pipe and a liquid supplementation pipe, wherein the liquid inlet pipe and the liquid supplementation pipe are respectively connected to the liquid supplementation bucket; the liquid inlet pipe and the liquid supplementation pipe are respectively provided with a control valve connected with the control system, the liquid supplementation bucket is internally provided with a liquid level detector with high accuracy, and one end of the liquid level detector with high accuracy stretches out from the liquid supplementation bucket and is connected with the control system.

15. The monocrystal and polycrystal texturing device according to claim 4, wherein the dipping acid texturing station, the spray alkali texturing station, the dipping alkali treatment station and the acid treatment station are all connected with an automatic liquid compensation system.

16. The monocrystal and polycrystal texturing device according to claim 15, wherein the automatic liquid supplementation system comprises a liquid supplementation bucket, a liquid inlet pipe and a liquid supplementation pipe, wherein the liquid inlet pipe and the liquid supplementation pipe are respectively connected to the liquid supplementation bucket; the liquid inlet pipe and the liquid supplementation pipe are respectively provided with a control valve connected with the control system, the liquid supplementation bucket is internally provided with a liquid level detector with high accuracy, and one end of the liquid level detector with high accuracy stretches out from the liquid supplementation bucket and is connected with the control system.

17. The monocrystal and polycrystal texturing device according to claim 4, wherein the acid texturing slot, the first spray washing slot of the first spray washing station, the alkali texturing slot, the spray washing slot of the second spray washing station, the alkali treatment slot, the spray washing slot of the third spray washing station, the acid treatment slot and the spray washing slot of the fourth spray washing station arranged in sequence from front to back form a main slot group, the slots in the main slot group are also provided with a water retaining component, and a sealing structure is arranged between adjacent slots in the main slot group.

* * * * *